United States Patent
Kawabata et al.

[11] Patent Number: 6,037,705
[45] Date of Patent: Mar. 14, 2000

[54] PIEZOELECTRIC TRANSFORMER INCLUDING RESILIENT ADHESIVE SUPPORT

[75] Inventors: Kenji Kawabata, Shiga-ken; Tetsuo Tatsumi, Itami; Hiroyuki Ishizaki; Etsuo Nishikawa, both of Shiga-ken; Isamu Fujimoto, Moriyama, all of Japan

[73] Assignee: Murata Manufacturing Co., Ltd., Japan

[21] Appl. No.: 09/031,499

[22] Filed: Feb. 26, 1998

[30] Foreign Application Priority Data

Feb. 26, 1997 [JP] Japan ................................. 9-42348
Feb. 26, 1997 [JP] Japan ................................. 9-42349

[51] Int. Cl.$^7$ ................................................. H01L 41/08
[52] U.S. Cl. ................................. 310/345; 310/348
[58] Field of Search ................................. 310/344, 345, 310/348, 346

[56] References Cited

U.S. PATENT DOCUMENTS

| | | | |
|---|---|---|---|
| 3,560,772 | 2/1971 | Lungo et al. | 310/345 X |
| 3,622,813 | 11/1971 | Kumon | 310/345 |
| 3,694,674 | 9/1972 | Inoue | 310/345 X |
| 3,885,173 | 5/1975 | Lee | 310/345 X |
| 3,903,733 | 9/1975 | Murayama et al. | 310/345 X |
| 5,250,870 | 10/1993 | Fenlon et al. | 310/345 |
| 5,459,368 | 10/1995 | Onishi et al. | 310/344 X |
| 5,821,665 | 10/1998 | Ohishi et al. | 310/344 X |
| 5,841,217 | 11/1998 | Kizaki et al. | 310/348 |
| 5,850,677 | 12/1998 | Ryoichi | 310/344 X |
| 5,925,974 | 7/1999 | Yamamoto et al. | 310/345 |

FOREIGN PATENT DOCUMENTS 09036453  2/1997  Japan .................................. 310/348

*Primary Examiner*—Mark O. Budd
*Attorney, Agent, or Firm*—Graham & James LLP

[57] ABSTRACT

A piezoelectric transformer includes a piezoelectric transforming element supported at its vibrational node region N on a base plate through a resilient adhesive member. Input electrodes of the piezoelectric transforming element are electrically connected to input electrode connecting lands of the base plate through a conductive adhesive which is adapted to be freely deformed according to the vibration of the piezoelectric transforming element. An output electrode of the piezoelectric transforming element is electrically connected to an output electrode connecting land of the base plate through a lead wire or a conductive adhesive.

17 Claims, 13 Drawing Sheets

PIEZOELECTRIC TRANSFORMER INCLUDING RESILIENT ADHESIVE SUPPORT

BACKGROUND OF THE INVENTION

1. Field of the Invention

The present invention relates to piezoelectric transformers, and more particularly, to a piezoelectric transformer for use in back-light inverters for liquid crystal displays, inverters for lighting fluorescent lamps or high-voltage power circuits for copiers.

2. Description of Related Art

One example of a conventional piezoelectric transformer is shown in FIGS. 13(A) and 13(B). This piezoelectric transformer is called a Rosen-type and includes a piezoelectric transforming element 5 having a rectangular piezoelectric plate 1 formed of piezoelectric ceramics on which input electrodes 2, 3 and an output electrode 4 are disposed. The input electrodes 2, 3 are located on two opposite major surfaces (top and bottom surfaces in FIGS. 13(A) and 13(B)) of the piezoelectric plate 1 and extend along one half portion of a length of the piezoelectric plate 1. An output electrode 4 is located on an end surface of the other half portion of the piezoelectric plate 1.

In this piezoelectric transformer, the piezoelectric transforming element 5 is vibrated in a second order mode ($\lambda$ mode) wherein, as shown in FIG. 13(B), vibration nodes (node points) $N_1$, $N_2$ at which the displacement of vibration is substantially zero occur at positions spaced from each other by a quarter length of the piezoelectric plate 1 from respective ends thereof so that vibration antinodes at which the vibration displacement has a maximum value occur at a center and at the two ends of the piezoelectric plate 1. In a piezoelectric transformer of the type shown in FIG. 13(A), therefore, the piezoelectric transforming element 5 is held by resilient members 6 formed of resin, rubber, or the like. The resilient members 6 are located at vibration node regions corresponding to the vibration nodes $N_1$, $N_2$ at which the vibration displacement has a minimum value such that the piezoelectric plate 1 is not hindered from vibrating a maximum amount.

The input electrodes 2, 3 and the output electrode 4 are respectively soldered with metal wires 7 so that the input electrodes 2, 3 and the output electrode 4 are respectively electrically connected to input-side and output-side terminal electrodes.

The inventors of the invention described and claimed in the present application have determined that the piezoelectric transformer having a structure as described above and as shown in FIGS. 13(A) and 13(B) experiences the following problems (1)–(5):

(1) Since the electrical connections of the input electrodes 2, 3 and the output electrode 4 to the input and output terminal electrodes are made via the metal wires 7, the metal wires 7 often cause a short-circuit or a wire-disconnection condition due to contact between one or more of the metal wires 7 with other electronic parts which have a large mounting area and which are located on a printed circuit board next to the transformer 1.

(2) The soldering of the metal wire 7 to the input electrode 2, 3 and the output electrode 4 requires changing the orientation and direction of the piezoelectric transforming element 5 depending upon the location of the input electrodes 2, 3 and the output electrode 4, so that the soldering operation for connecting the metal wires 7 to the electrodes 2–4 is complicated and increases the process steps, thereby preventing improvements in mass productivity.

(3) Since the piezoelectric transforming element 5 is mounted within resilient members 6 made of resin, rubber or the like at the node regions corresponding to the nodes $N_1$, $N_2$ of the piezoelectric plate 1 and the resilient members 6 are arranged so as to be located on both of the opposite major surfaces of the piezoelectric plate 3, it is difficult to make the component sufficiently thin and to manufacture it at relatively low cost.

(4) The solder for electrically connecting the metal wire 7 to the input electrodes 2, 3 and the output electrode 4 hinders the piezoelectric plate 1 from vibrating, causing a decrease in the pressure-increase ratio and conversion efficiency for the piezoelectric transformer.

(5) Vibration stresses are concentrated at soldered portions where the metal wires 7 are joined to the input electrodes 2, 3 so that, when vibration is great at such soldered portions, the metal wires 7 are apt to break in the vicinity of the connection to the input electrodes 2, 3 or the output electrode 4.

SUMMARY OF THE INVENTION

To overcome the above-described disadvantages and problems, the preferred embodiments of the present invention provide a piezoelectric transformer which has a small mounting area, a low mounting height and significantly reduced thickness while providing excellent reliability and facilitating mass productivity.

According to one preferred embodiment of the present invention, a piezoelectric transformer includes a piezoelectric transforming element having a piezoelectric plate, and an input electrode and an output electrode provided on the piezoelectric plate; a base plate supporting the piezoelectric transforming element and including at least one terminal electrode disposed on a surface thereof; and a connecting member disposed between the base plate and the piezoelectric transforming element for mechanically and electrically connecting the piezoelectric transforming element to the base plate.

The connecting member preferably includes a conductive adhesive material for securing the piezoelectric transforming element to the base plate. The connecting member is preferably a single unitary body which includes two conductive adhesive portions and an insulative adhesive portion disposed between the two conductive adhesive portions. The two conductive adhesive portions are preferably located so as to electrically connect respective input and output electrodes disposed on the piezoelectric transforming element to electrodes disposed on the base plate. The insulative adhesive portion is located so as to prevent a short circuit between the input and output electrodes and the electrodes on the base plate connected thereto.

The conductive adhesive members and the insulative adhesive member of the connecting member are preferably constructed to be resilient and have a certain degree of elasticity to elastically support the piezoelectric transformer on the base plate. This allows for vibration of the piezoelectric transformer element to occur without being suppressed.

Preferably, the connecting member is positioned at a nodal portion at which a vibrational node of the piezoelectric transforming element exists and the connecting member extends across substantially an entire width of the piezoelectric plate of the piezoelectric transformer.

According to another preferred embodiment of the present invention, a piezoelectric transformer includes a piezoelectric transforming element having a piezoelectric plate, an input electrode and an output electrode provided on the piezoelectric plate; a base plate on which the piezoelectric transforming element is supported, the base plate including at least one terminal electrode; a resilient adhesive member disposed between the base plate and the piezoelectric transforming element for elastically connecting and supporting the piezoelectric transforming element on the base plate, and a conductive adhesive for electrically connecting at least one of the input and output electrodes of the piezoelectric transforming element to the terminal electrode provided on the base plate.

The resilient adhesive member is arranged and adapted to elastically support the piezoelectric transformer on the base plate due to the inherent elasticity of the resilient adhesive member so that the piezoelectric transforming element is supported to allow vibration thereof on the base plate without affecting or suppressing vibration of the piezoelectric plate of the piezoelectric transforming element. Also, the resilient adhesive member connects, through the inherent adhesiveness of the resilient adhesive member, the piezoelectric transforming element on the base plate.

Further, the conductive adhesive is adapted and arranged to freely deform according to the vibration of the piezoelectric transforming element to thereby prevent suppression of vibration of the piezoelectric transformer element, while electrically connecting the input electrode and the output electrode of the piezoelectric transforming element to the terminal electrodes.

As a result of this structure and arrangement of the preferred embodiments of the present invention, a piezoelectric transformer having excellent characteristics and high reliability is achieved with significantly reduced deterioration in transformer characteristics and which is arranged to eliminate concentration of vibration stresses in the input electrode or the output electrode.

In the piezoelectric transformer according to another preferred embodiment of the present invention, at least one of the input and output electrodes may have a connecting portion provided on a main surface of the piezoelectric plate at a location so as to face the base plate, and the connecting portion and the terminal electrode may be electrically connected to each other through the conductive adhesive.

When the input electrode and the output electrode of the piezoelectric transforming element are extended to one main surface of the piezoelectric plate, it is possible to electrically connect the input electrode and the output electrode at one main surface of the piezoelectric plate, to terminal electrodes on the base plate by using a conductive adhesive, thereby reducing the mounting area of the piezoelectric transforming element on the base plate. Moreover, when the piezoelectric transforming element is mounted on the base plate, it is satisfactory to apply a conductive adhesive to one surface of the piezoelectric transforming element, enhancing the efficiency of the mounting operation for the piezoelectric transforming element.

Preferably, the resilient adhesive member is located between the connecting portion and the terminal electrode, and the connecting portion and the terminal electrode are electrically connected therebetween through the conductive adhesive.

In another preferred embodiment, recesses may be formed in the resilient adhesive member and filled with the conductive adhesive. In such an arrangement, the conductive adhesive, before curing, is restricted from flowing by the peripheral walls of the recessed portion formed in the resilient adhesive member. As a result, the conductive adhesive after curing has a stable form and is securely located to prevent against short-circuit accidents caused by spreading of the conductive adhesive, thus enhancing mounting density for the piezoelectric transformer.

Also, since the conductive adhesive after curing has a stable form, the conductive adhesive has a constant resistance value thereby providing piezoelectric transformers with less characteristic variations. Further, since the conductive adhesive is substantially surrounded by the resilient adhesive member, there is no possibility that the conductive adhesive is contaminated by foreign matters being affixed thereto or that an external force is applied thereto. As a result, a piezoelectric transformer with high reliability is achieved. Further, the resilient adhesive member, except for the recessed portion, contributes to the support of the piezoelectric transforming element. Accordingly, the adhesive area is broadened to thereby increase the supporting strength for the piezoelectric transforming element.

Preferably, the resilient adhesive member and the conductive adhesive are positioned at a nodal portion at which a vibrational node of the piezoelectric transforming element exists.

By this arrangement, the resilient adhesive member and the conductive adhesive are almost stationary even if the piezoelectric plate vibrates, so that there is no possibility that the resilient adhesive member and the conductive adhesive hinder the piezoelectric plate from vibrating, thereby providing an excellent-characteristic high-efficiency piezoelectric transformer.

Other features and advantages of the present invention will become apparent from the following description of preferred embodiments of the invention which refers to the accompanying drawings, wherein like reference numerals indicate like elements to avoid duplicative description.

DETAILED DESCRIPTION OF PREFERRED EMBODIMENTS

Figure 1A:
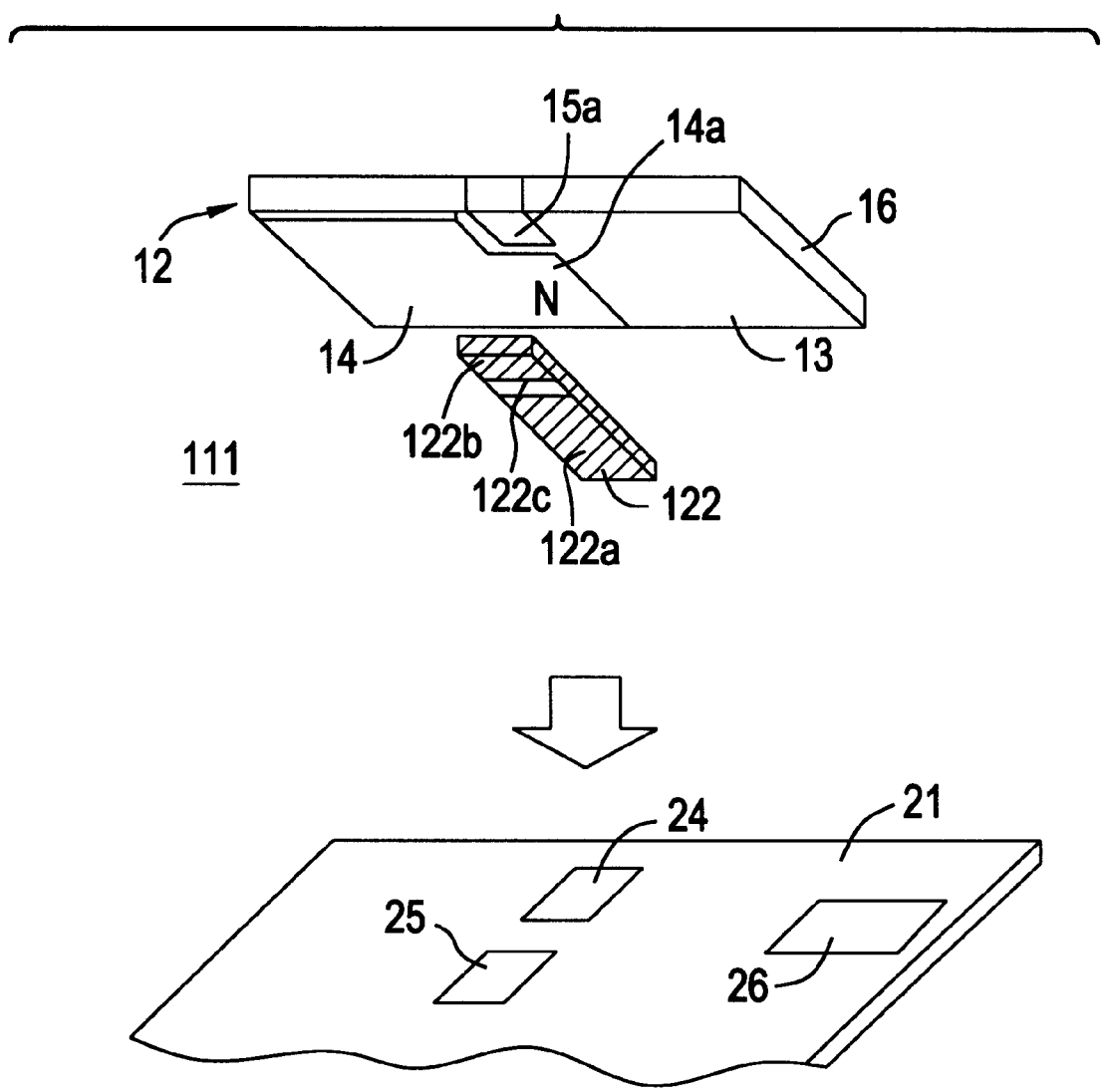
FIG. 1(A) is an exploded perspective view of a first preferred embodiment of the present invention.

A piezoelectric transformer according to a first preferred embodiment of the present invention is shown in FIG. 1(A). The piezoelectric transformer 111 is preferably arranged and adapted to vibrate in a basic (primary) vibration mode called a $\lambda/2$ mode of a piezoelectric transforming element 12. The piezoelectric transforming element 12 is provided with a piezoelectric plate 13 preferably formed of piezoelectric ceramics and having a substantially rectangular-plate shape. The piezoelectric plate 13 includes input electrodes 14, 15 disposed on opposite major surfaces of the piezoelectric plate 13 (top and bottom surfaces). The input electrodes 14, 15 extend in a lengthwise direction along substantially a one half portion of the piezoelectric plate 13. An output electrode 16 is disposed on an end surface of the other half portion of the piezoelectric plate 13. The piezoelectric plate 13 is polarized in a thickness direction in the one half portion which includes the input electrodes 14, 15, and polarized in a lengthwise direction in the other half portion. The piezoelectric transforming element 12 has vibration nodes existing at a lengthwise ½ ($\lambda/4$) positions of the piezoelectric plate 13 at which the vibrational displacement has zero value, and vibrational antinodes at which the vibrational displacement has a maximum value existing at respective ends of the piezoelectric plate 13.

The input electrode 14 disposed on the bottom surface of the piezoelectric plate 13 and facing the base plate 21, as shown in FIG. 1(A), has two corners positioned at nodal portions N corresponding to the vibrational nodes located substantially at a center of the piezoelectric plate 13. One of the two corners of the input electrode 14 is removed from the piezoelectric plate 13 and the other corner portion positioned at the remaining nodal portion constitutes a connecting portion 14a of the input electrode 14. This connecting portion 14a at the vibrational nodal portion N preferably extends to one side surface of the piezoelectric plate 13 as seen in FIG. 1(A).

The other electrode 15 disposed on the surface of the piezoelectric plate 13, as shown in FIG. 1(B), has a connecting portion 15a reaching, via a side edge surface of the piezoelectric plate 13, the corner portion where a portion of the input electrode 14 has been removed.

A connecting member 122 is disposed at a location of the connecting portions 14a, 15a of the two input electrodes 14, 15. The connecting member 122 preferably has a length that is almost equal to the width of the piezoelectric plate 13. The connecting member 122 preferably includes a first conductive adhesive portion 122a, a second conductive adhesive portion 122b and an insulative adhesive portion 122c. The insulative adhesive portion 122c is preferably disposed between the first and second conductive adhesive portions 122a, 122b.

The connecting member 122 including the first conductive adhesive portion 122a, the second conductive adhesive portion 122b and the insulative adhesive portion 122c are adhered onto the base plate 21. This arrangement allows the piezoelectric transforming element 12 to be supported and connected at its vibrational nodal portion N via the connecting member 122 on the base plate 21.

The base plate 21 has a mounting surface for the piezoelectric transforming element 12. The mounting surface of the base plate 21 includes input electrode connecting lands 24, 25 which are arranged to function as input terminal electrodes and are electrically connected respectively with the input electrodes 14, 15 and the output electrode 16, as well as, an output electrode connecting land 26 which functions as an output terminal electrode.

The input electrode connecting lands 24, 25 are electrically connected to the connecting portions 14a, 15a of the input electrodes 14, 15 preferably through the first and second conductive adhesive portions 122a, 122b of the connecting member 122, respectively.

The conductive adhesive portions 122a, 122b of the connecting member 122 preferably may include a conductive filler, a binding agent and additives. It is possible that the conductive filler comprises an Au powder, an Ag powder, a Cu powder, an Ni powder, an Al powder, carbon black, graphite, a carbon fiber, or an Ag-soldered particle. It is possible that the binder can comprise an acrylic resin, an epoxy resin, a vinyl resin, an acrylic-denatured polyurethane resin, a rubber-based resin, an epoxy polyamide resin, or the like. Further, the additive preferably contains a dispersing agent for enhancing filler dispersion, a lubricant for providing wear resistance, a conductive-filler sedimentation preventive agent, and other similar substances. The insulative adhesive portion 122c of the connecting member 122 preferably comprises a material having sufficient adhesiveness and elasticity. For example, the resilient connecting member 122 may include a double-sided adhesive tape of a normal temperature adhesion or cure adhesion type, an adhesive rubber sheet such as a silicone rubber, or adhesive or sticking gel such as acrylic gel.

In the piezoelectric transformer ill having the structure and arrangement shown in FIGS. 1(A) as explained above, the piezoelectric transformer element 12 is supported on the base plate 21 through the connecting member 122 having an elasticity that is sufficient to ensure that there is no possibility that vibration of the piezoelectric transforming element 12 is hindered or suppressed. Also, by choosing a sufficient resistivity or hardness of the conductive adhesive portions 122a, 122b of the connecting member 122, it is possible to obtain electrical conduction between the piezoelectric transforming element 12 and the input electrode connecting lands 24, 25 of the base plate 21 without obstructing the vibration of the piezoelectric transforming element 12. Further, since the conductive adhesive portions 122a, 122b of the connecting member 122 possess elasticity, there is no concentration of vibration stresses of the piezoelectric transforming element 12 in the conductive adhesive 27 applied to any portion to the input electrodes 14, 15. The input electrodes 14, 15 therefore avoid damage thereto resulting from vibration generated by the piezoelectric transforming element 12.

Figure 2A:
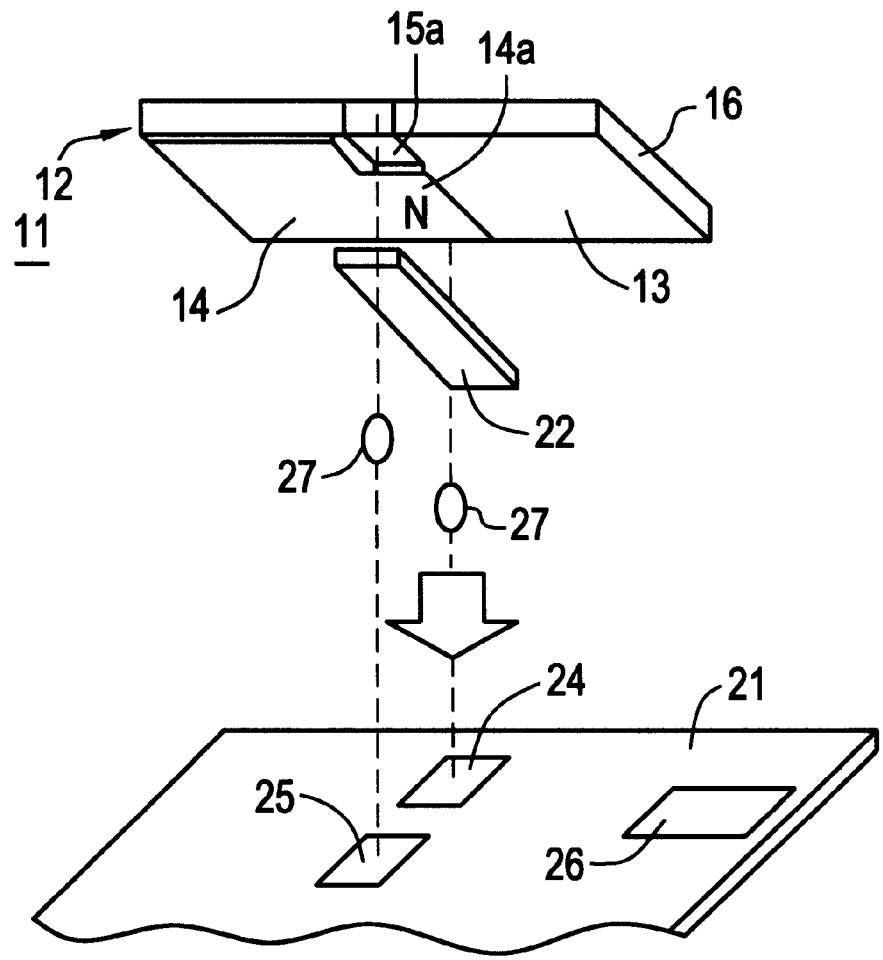
FIG. 2(A) is an exploded perspective view of a second preferred embodiment of the present invention.
Figure 2B:
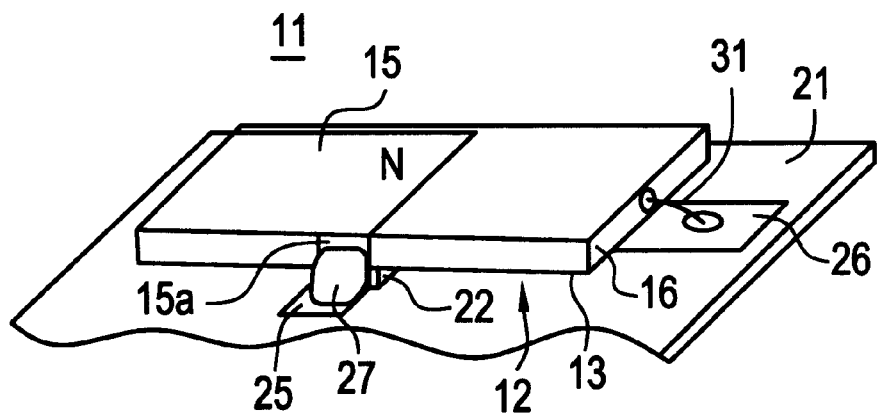
FIG. 2(B) is a perspective view of the second preferred embodiment of the piezoelectric transformer shown in FIG. 2(A) in an assembled state.

A piezoelectric transformer 11 according to a second preferred embodiment of the present invention is shown in FIGS. 2(A) and 2(B). This piezoelectric transformer 11 is similar to the transformer of the second preferred embodiment shown in FIG. 2(A) except that the connecting member 122 shown in FIG. 2(A) is replaced by a resilient adhesive member 22 and a conductive adhesive 27 as described below.

The resilient adhesive member 22 is disposed at a location of the connecting portions 14a, 15a of the two input electrodes 14, 15. The resilient adhesive member 22 preferably has a length that is almost equal to the width of the piezoelectric plate 13.

The resilient adhesive member 22 is adhered onto the base plate 21. This arrangement allows the piezoelectric transforming element 12 to be supported and connected at its vibrational nodal portion N via the resilient adhesive member 22 on the base plate 21. The resilient adhesive member 22 preferably comprises a material having sufficient adhesiveness and elasticity. For example, the resilient adhesive member 22 may comprise a double-sided adhesive tape of a normal temperature adhesion or cure adhesion type, an adhesive rubber sheet such as a silicone rubber, or adhesive or sticking gel such as acrylic gel.

The base plate 21 has a mounting surface for the piezoelectric transforming element 12. The mounting surface of the base plate 21 includes input electrode connecting lands 24, 25 which are arranged to function as input terminal electrodes and are electrically connected respectively with the input electrodes 14, 15 and the output electrode 16, as well as, an output electrode connecting land 26 which functions as an output terminal electrode.

The input electrode connecting lands 24, 25 are electrically connected to the connecting portions 14a, 15a of the input electrodes 14, 15 preferably through the conductive adhesive 27. The conductive adhesive 27 is preferably applied by a dispenser or the like and cured to be located at positions at opposite ends of the resilient adhesive member 21 as seen in FIG. 1(A) and FIG. 1(B). The conductive adhesive 27 is preferably located at side edge surfaces of the piezoelectric plate 13 such that the conductive adhesive 27 bridges gaps between the input electrode connecting lands 24, 25 and the connecting portions 14a, 15a of the input electrodes 14, 15.

The conductive adhesive 27 preferably contains a conductive filler, a binding agent and additives. It is possible that the conductive filler comprises an Au powder, an Ag powder, a Cu powder, an Ni powder, an Al powder, carbon black, graphite, a carbon fiber, or an Ag-soldered particle. It is possible that the binder can comprise an acrylic resin, an epoxy resin, a vinyl resin, an acrylic-denatured polyurethane resin, a rubber-based resin, an epoxy polyamide resin, or the like. Further, the additive preferably contains a dispersing agent for enhancing filler dispersion, a lubricant for providing wear resistance, a conductive-filler sedimentation preventive agent, and other similar substances.

The output electrode 16 of the piezoelectric transforming element 12 may be soldered with one end of a lead wire 31, as shown in FIG. 2(B). The other end of the lead wire 31 is preferably soldered to the output electrode connecting land 26 of the base plate 21.

In the piezoelectric transformer 11 having the structure and arrangement shown in FIGS. 2(A) and 2(B) as explained above, the piezoelectric transformer element 12 is supported on the base plate 21 through the resilient adhesive member 22 having an elasticity that is sufficient to ensure that there is no possibility that vibration of the piezoelectric transforming element 12 is hindered or suppressed. Also, by choosing a sufficient resistivity or hardness of the conductive adhesive 27, it is possible to obtain electrical conduction between the piezoelectric transforming element 12 and the input electrode connecting lands 24, 25 of the base plate 21 without obstructing the vibration of the piezoelectric transforming element 12. Further, since the conductive adhesive 27 possesses elasticity, there is no concentration of vibration stresses of the piezoelectric transforming element 12 in the conductive adhesive 27 applied portions to the input electrodes 14, 15. The input electrodes 14, 15 therefore avoid damage thereto resulting from vibration generated by the piezoelectric transforming element 12.

Figure 3A:
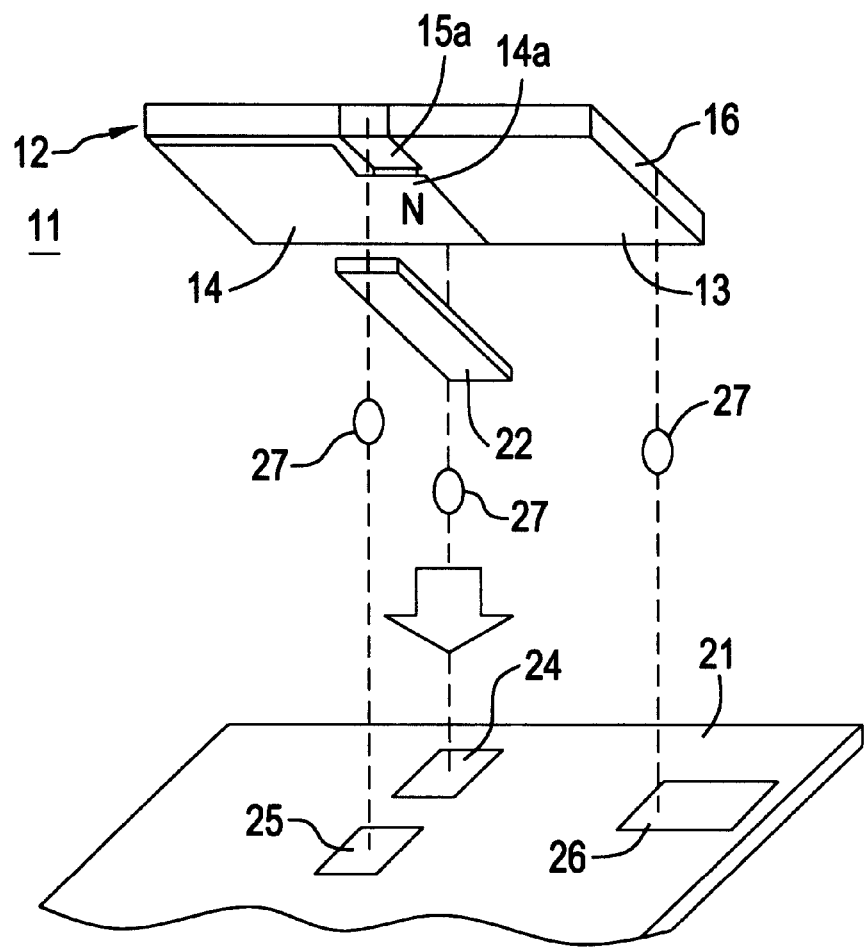
FIG. 3(A) is an exploded perspective view of a modification to the second preferred embodiment of the present invention.
Figure 3B:
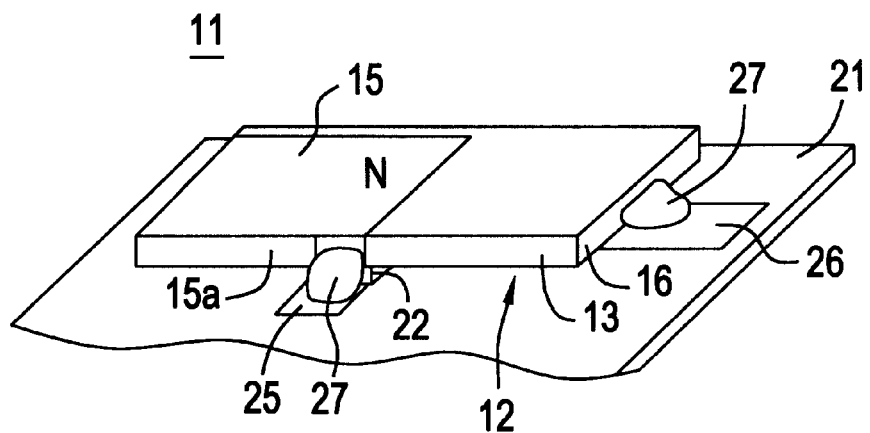
FIG. 3(B) is a perspective view of the modification to the second preferred embodiment of the piezoelectric transformer shown in FIG. 3(A) in an assembled state.

Although in the piezoelectric transformer 11 shown in FIG. 2(A) and FIG. 2(B), the output electrode 16 and the output electrode connecting land 26 of the base plate 21 are connected through the lead wire 31, the output electrode 16 and the output electrode connecting land 26 may be connected by a ribbon wire, or may be connected through the conductive adhesive 27 as shown in FIG. 3(A) and FIG. 3(B).

Figure 4A:
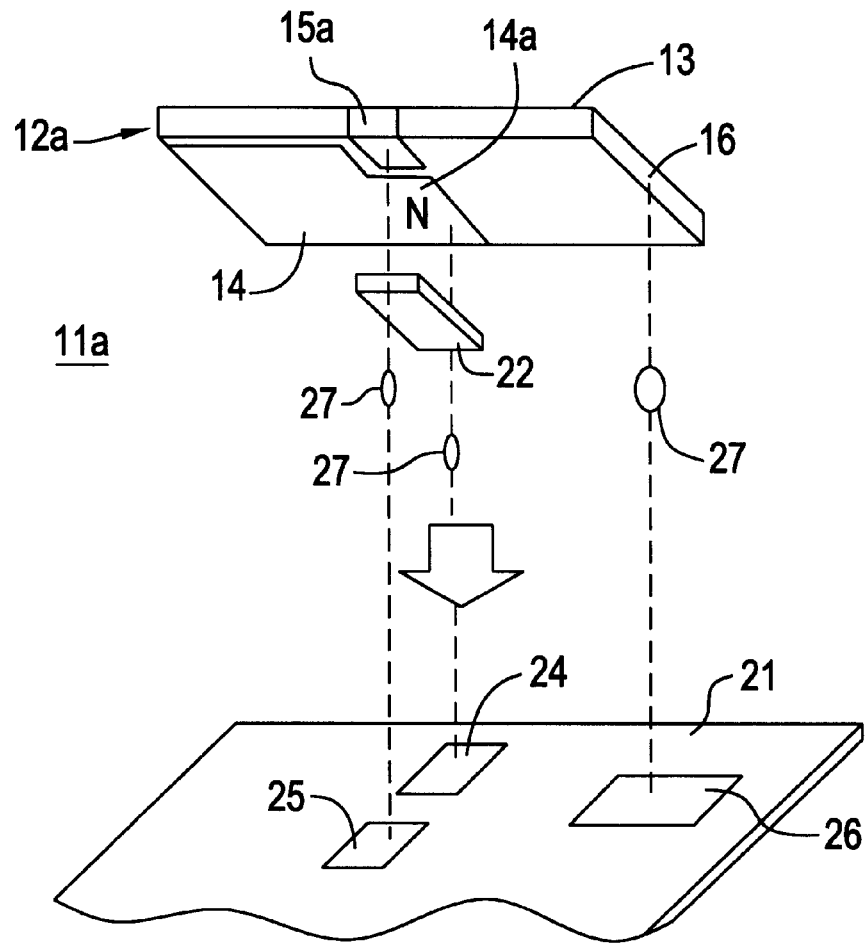
FIG. 4(A) is an exploded perspective view of a third preferred embodiment of the present invention.
Figure 4B:
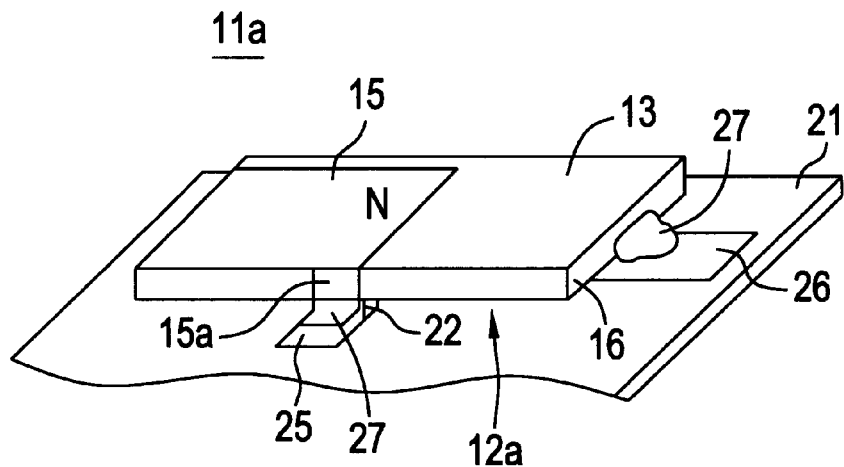
FIG. 4(B) is a perspective view of the third preferred embodiment of the piezoelectric transformer shown in FIG. 4(A) in an assembled state.

A piezoelectric transformer 11a shown in FIG. 4(A) and FIG. 4(B) has a resilient adhesive member 22 which is shorter in length than the resilient adhesive member 22 shown in FIG. 1(A) and FIG. 2(A). Thus, the resilient adhesive member 22 shown in FIG. 4(A) extends along less than an entire width of the piezoelectric transforming element 12a. A conductive adhesive 27 is applied and cured between the connecting portions 14a, 15a of the input electrodes 14, 15 and the input electrode connecting lands 24, 25 of the base plate 21, so that electrical connection is made between the connecting portion 14a, 15a and the input electrode connecting land 24, 25. Also, the output electrode 16 of the piezoelectric transforming element 12a and the output electrode connecting land 26 of the base plate 21 are electrically connected therebetween through a conductive adhesive 27.

Figure 5A:
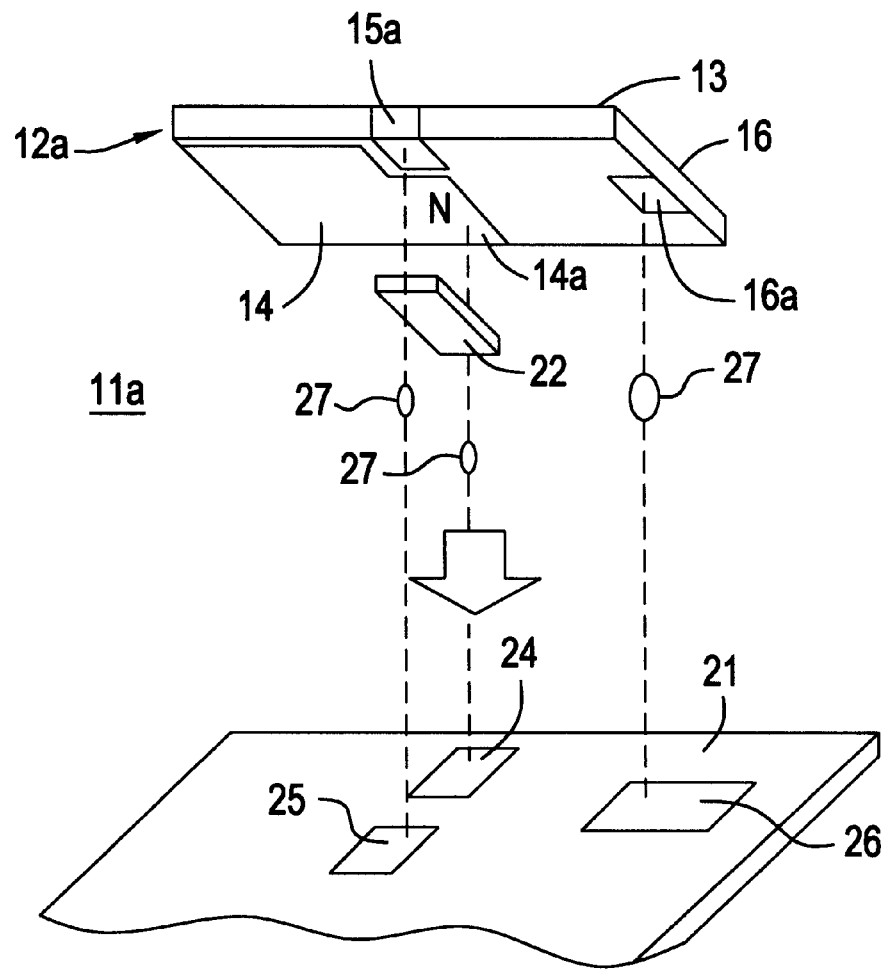
FIG. 5(A) is an exploded perspective view of a modification to the third preferred embodiment of the present invention.
Figure 5B:
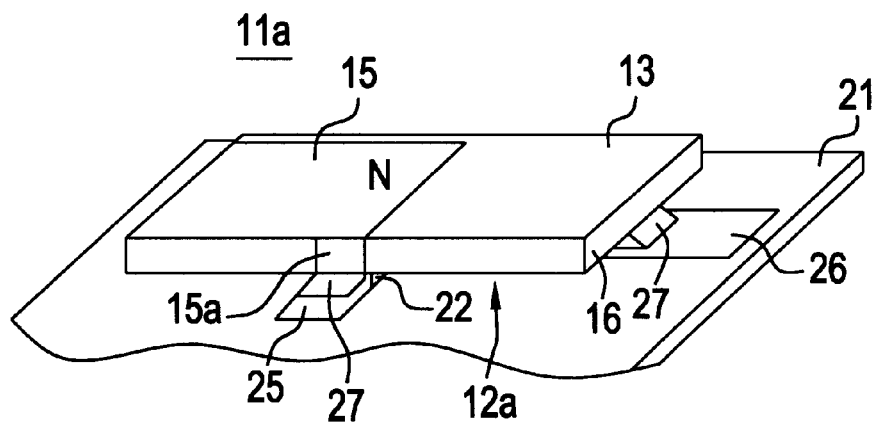
FIG. 5(B) is a perspective view of the modification to the third preferred embodiment of the piezoelectric transformer shown in FIG. 5(A) in an assembled state.

At this time, the output electrode 16 of the piezoelectric transforming element 12a may also be extended, as shown in FIG. 5(A) and FIG. 5(B), to the bottom surface of the piezoelectric plate 13 where the input electrode 14 is located so as to form a connecting portion for the output electrode 16. In FIGS. 4(A), 4(B) and FIGS. 5(A), 5(B) the portions corresponding to FIGS. 1(A), 2(A), 2(B) and FIGS. 3(A), 3(B) are denoted by the corresponding reference numerals to thereby omit explanations thereof.

In the third preferred embodiment, the conductive adhesive 27 does not extend to a side surface of the piezoelectric transforming element 12a so that it is possible to further reduce the mounting area for the piezoelectric transforming element 12a. Meanwhile, in the piezoelectric transformer 11a shown in FIGS. 5(A) and 5(B), the connecting portions 14a, 15a of the input electrodes 14, 15 and the connecting portion 16a of the output electrode 16 are both positioned on one main surface (bottom surface) of the piezoelectric plate 13 so that the conductive adhesive is easy to apply, thereby enhancing the efficiency of the assembling process for the piezoelectric transformer 11a.

Figure 6A:
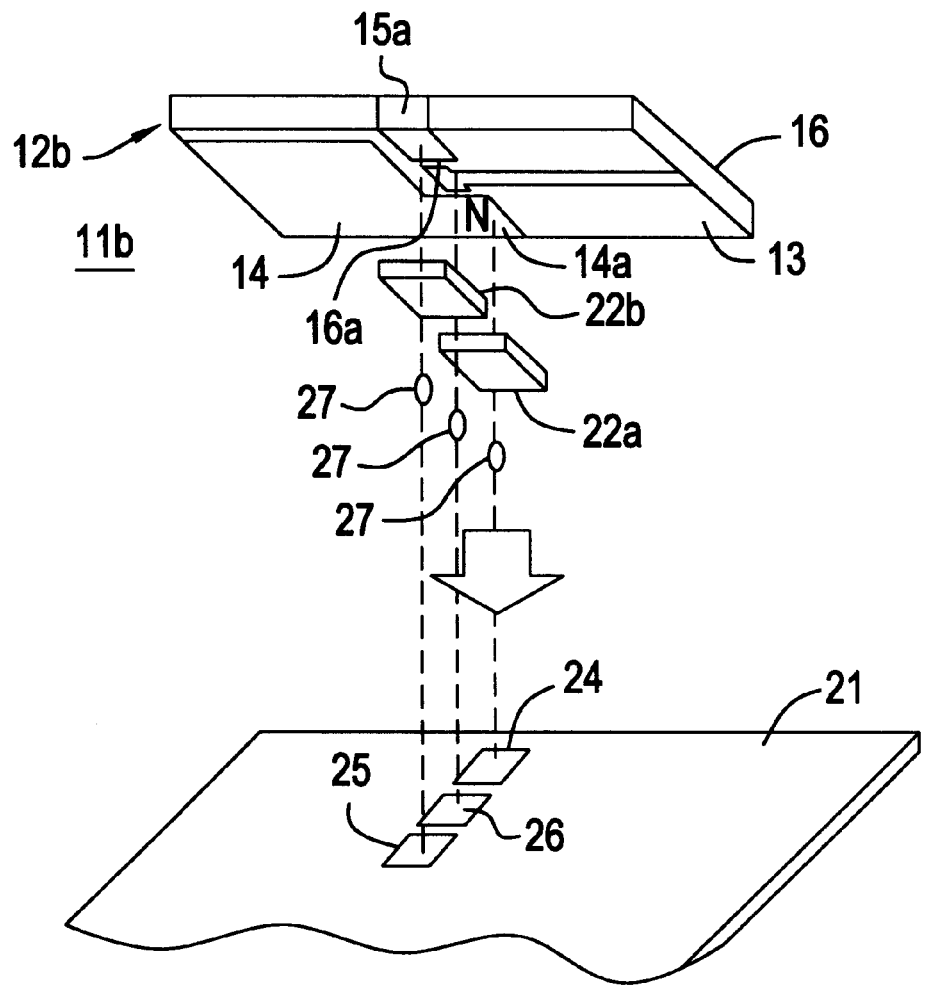
FIG. 6(A) is an exploded perspective view of a fourth preferred embodiment of the present invention.
Figure 6B:
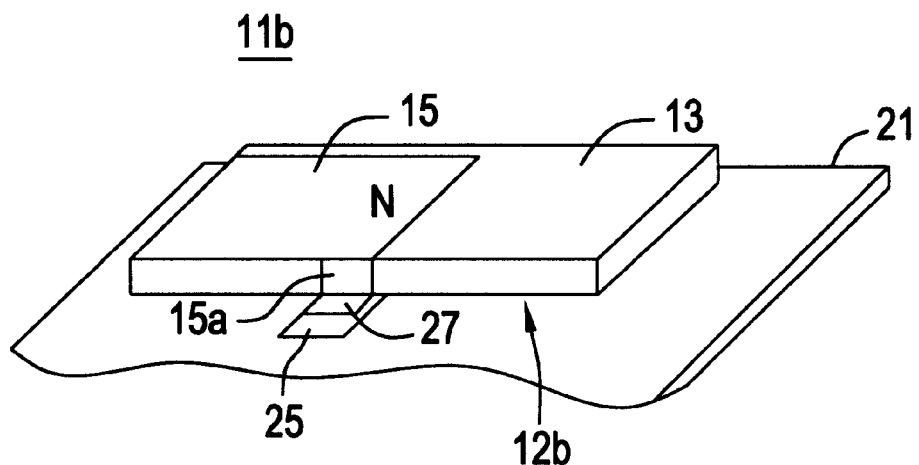
FIG. 6(B) is a perspective view of the fourth preferred embodiment of the piezoelectric transformer shown in FIG. 6(A) in an assembled state.

In a piezoelectric transformer 11b shown in FIG. 6(A) and FIG. 6(B), a piezoelectric transforming element 12b has, on its bottom surface, a space between a connecting portion 14a of the input terminal 14 and a connecting portion 15a of the input electrode 15. A connecting portion 16a of the output electrode 16 is extended so as to be located in the space provided between a connecting portion 14a of the input terminal 14 and a connecting portion 15a of the input electrode 15. The piezoelectric transforming element 12b is adhered to and held on the base plate 21 preferably via two resilient adhesive members 22a, 22b.

A first one 22a of the two resilient adhesive members is arranged so as to bridge the gap between the connecting portion 14a and the connecting portion 16a. The other 22b of the two resilient adhesive members is arranged so as to bridge the gap between the connecting portion 15a and the connecting portion 16a.

A conductive adhesive 27 preferably is applied by a dispenser and cured, respectively, between the connecting portion 14a and the input electrode connecting land 24, between the connecting portion 16a and the input electrode connecting land 26, and between the connecting portion 15a and the input electrode connecting land 25. Thus, the connecting portions 14a, 15a, and 16a are respectively electrically connected to the input electrode connecting lands 24, 25 and the output electrode connecting land 26. Also in FIG. 6(A) and FIG. 6(B), the portions corresponding to FIGS. 1(A), 2(A), 2(B) and FIGS. 3(A), 3(B) are denoted by the corresponding reference numerals, omitting explanations thereof.

In the fourth preferred embodiment, since no conductive adhesive 27 extends to the side surface of the piezoelectric transforming element 12b as can be understood from FIG. 6(B), it is possible to further reduce the mounting area for the piezoelectric transforming element 12b. Also, since the connecting portions 14a, 15a, and 16a are all located on the one major surface (bottom surface) of the piezoelectric plate 13, the conductive adhesive 27 is easy to apply, enhancing the efficiency of assembling the piezoelectric transformer 11. This efficiency is further improved if the connecting portions 14a, 15a and 16a are aligned with each other as shown in FIG. 6(A).

Figure 7A:
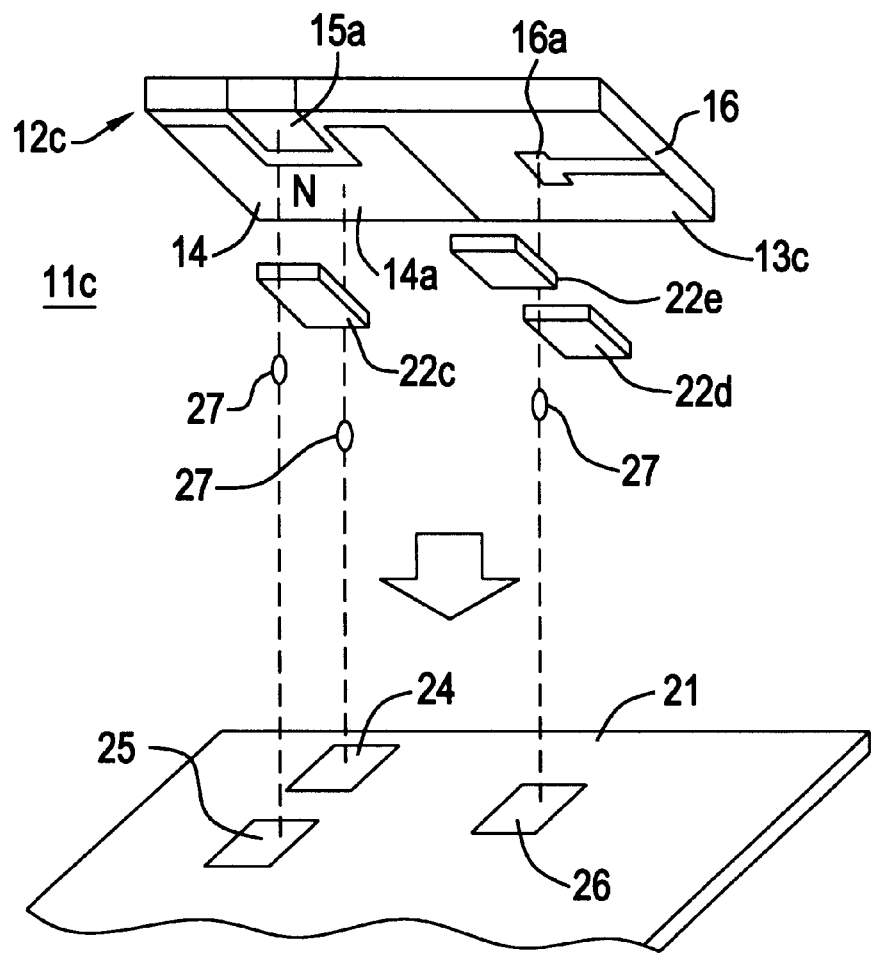
FIG. 7(A) is an exploded perspective view of a fifth preferred embodiment of the present invention.
Figure 7B:
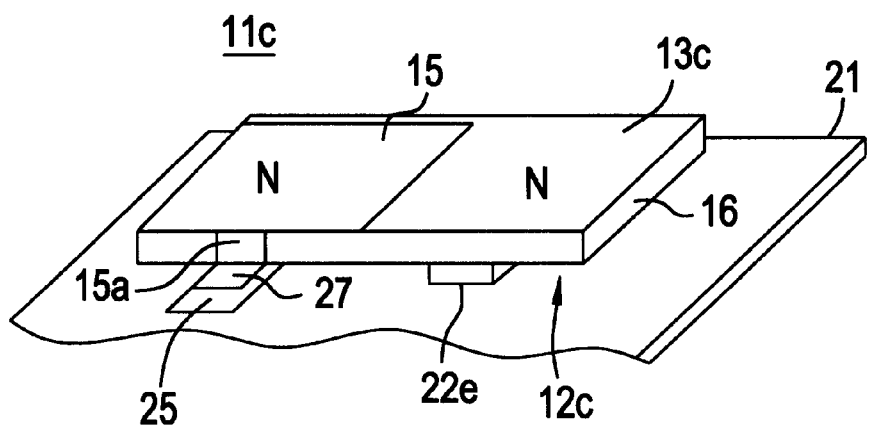
FIG. 7(B) is a perspective view of the fifth preferred embodiment of the piezoelectric transformer shown in FIG. 7(A) in an assembled state.
Figure 13A:
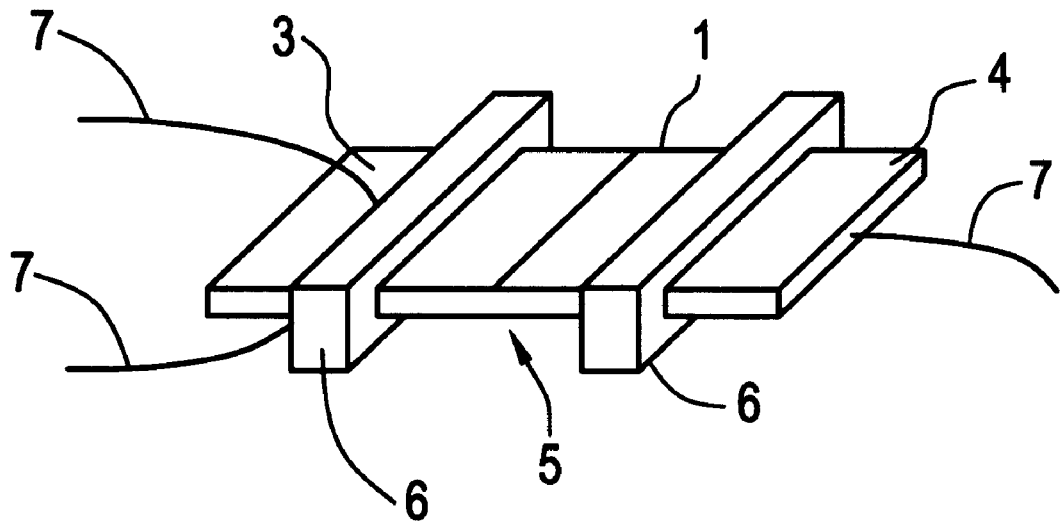
FIG. 13(A) is a perspective view in an assembled state of a prior art piezoelectric transformer.
Figure 13B:
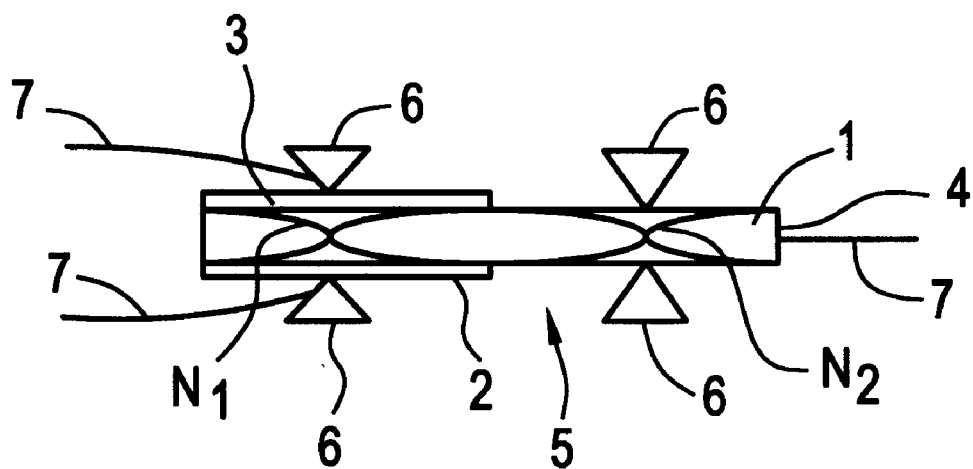
FIG. 13(B) is an explanatory view of the vibrational mode and the support in the conventional piezoelectric transforming element of FIG. 13(A).

According a fifth preferred embodiment, a piezoelectric transformer 11c comprises a piezoelectric transformer which is adapted and arranged to vibrate in the second mode (λ mode), as explained with reference FIGS. 13(A) and 13(B), to which the structure shown in FIGS. 7(A) and 7(B) is applied. A piezoelectric transforming element 12c has vibrating nodes, at which the vibrational displacement becomes zero, existing at positions spaced by a quarter of the length of the piezoelectric plate 13c from respective ends thereof, and vibrational antinodes, at which the vibrational displacement has a maximum value, existing at the center and the both ends of the piezoelectric plate 13c.

The piezoelectric transforming element 12c has one input electrode 14 having a portion removed therefrom at a nodal portion N corresponding to one vibrational node, as shown in FIG. 7(A). A connecting portion 15a of the other input electrode 15 extends into an area of the removed portion of the electrode 14 on the transforming element 12c. A connected portion 16a of the output electrode 16 extends to a nodal portion N corresponding to the other vibrational node. Also, a resilient adhesive member 22c has a length somewhat smaller than the width of the piezoelectric plate 13c, while resilient adhesive members 22d, 22e each have a length somewhat smaller than a half of the width of the piezoelectric plate 13. The piezoelectric transforming element 12c is held at the two node regions N by the base plate 21 through the resilient adhesive members 22c, 22d and 22e.

In the fifth preferred embodiment, it is possible to further reduce the mounting area for a piezoelectric transformer vibrating in the second order vibrational mode, in addition to, facilitating application of a conductive adhesive 27 and enhancing the efficiency of assembling the piezoelectric transformer.

Figure 8A:
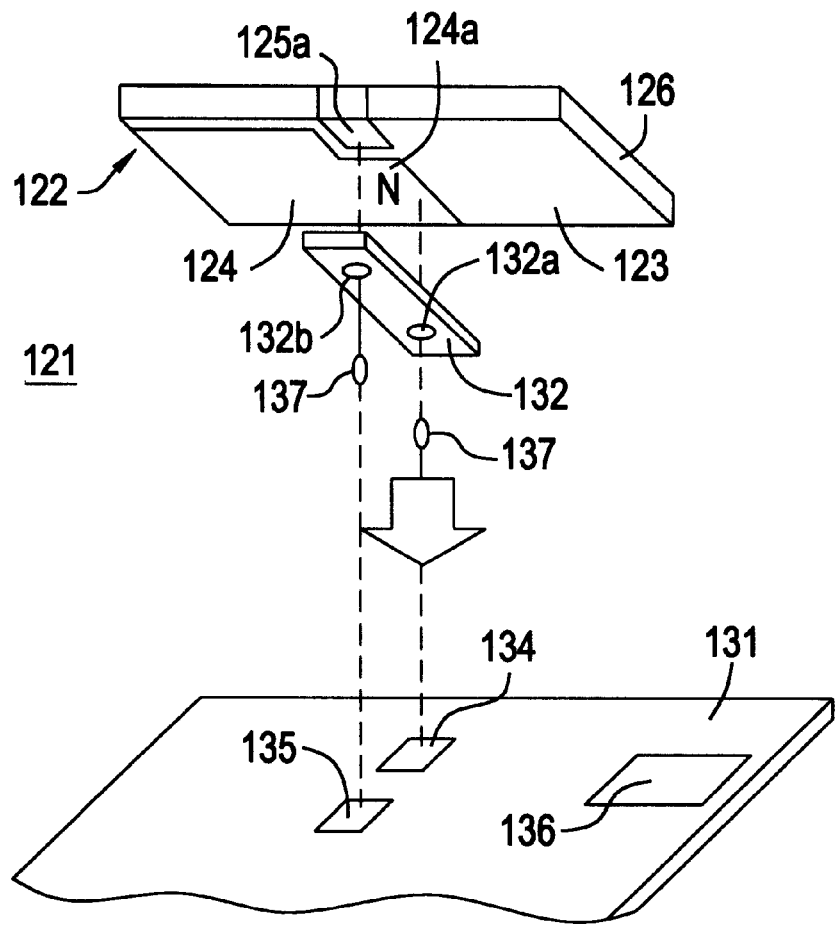
FIG. 8(A) is an exploded perspective view of a sixth preferred embodiment of the present invention.
Figure 8B:
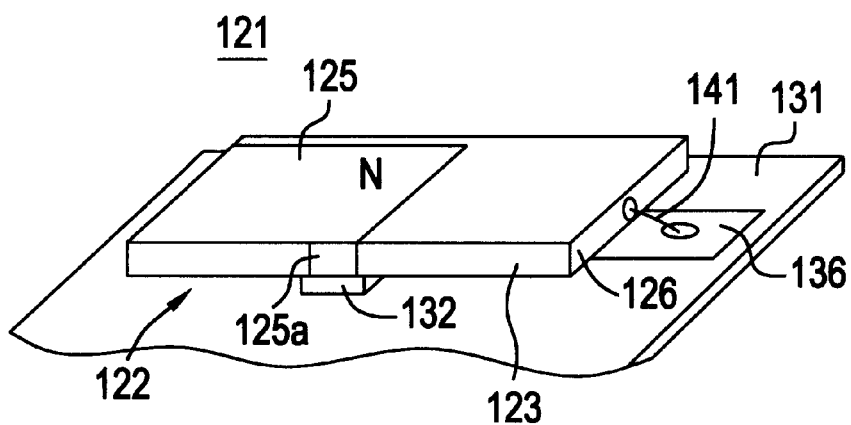
FIG. 8(B) is a perspective view of the sixth preferred embodiment of the piezoelectric transformer shown in FIG. 8(A) in an assembled state.

A piezoelectric transformer according to a sixth preferred embodiment of the present invention is shown in FIG. 8(A) and FIG. 8(B). This piezoelectric transformer 121 is adapted and arranged to vibrate in a basic (primary) vibration mode called a λ/2 mode for the piezoelectric transforming element 122. The piezoelectric transforming element 122 is provided with a piezoelectric plate 123 preferably formed of piezoelectric ceramics and preferably having a substantially rectangular shape. The piezoelectric plate 123 has input electrodes 124, 125 disposed on opposite major surfaces of the plate 123 which electrodes extend in a lengthwise direction about one half portion of the plate 123. An output electrode 126 is located on an end surface of the other half portion of the plate 123. The piezoelectric plate 123 is polarized in a thickness direction in the one half portion of the plate 123 having the input electrodes 124, 125, and polarized in a lengthwise direction in the other half portion of the plate 123. The piezoelectric transforming element 122 has vibration nodes existing at a lengthwise ½ (λ/4) positions of the piezoelectric plate 123 at which the vibrational displacement has a zero value, and vibrational antinodes at which the vibrational displacement has a maximum value existing at respective ends of the piezoelectric plate 123.

The input electrode 124 is disposed on the bottom surface of the piezoelectric plate 123 so as to face the base plate 131, as shown in FIG. 8(A). The input electrode 124 has two corners positioned at node areas N corresponding to the vibrational nodes, at one corner, the input electrode material is removed and the other corner positioned at the remaining node area constitutes a connecting portion 124a of the input electrode 124. This connecting portion 124a at the vibrational node area N extends to one side surface of the piezoelectric plate 123.

The other electrode 125 disposed on the surface of the piezoelectric plate 123 has a connecting portion 125a reaching, via a side surface of the piezoelectric plate 123, the corner portion where the input electrode 124 has been removed.

A resilient adhesive member 132 is arranged at the connecting portions 124a, 125a of the two input electrodes

124, 125 and has a length almost equal to the width of the piezoelectric plate 123 so that the resilient adhesive member 132 is adhered onto the base plate 131. This enables the piezoelectric transforming element 122 to be secured and supported at its vibrational node area N via the resilient adhesive member 132 on the base plate 131. The resilient adhesive member 132 preferably possesses sufficient adhesiveness and a low mounting profile in addition to elasticity. A double-sided adhesive tape of a normal temperature adhesion or cure adhesion type, an adhesive rubber sheet such as of a silicone rubber, or adhesive or sticking gel such as acrylic gel may be used to form the resilient adhesive member 132.

The base plate 131 has a mounting surface for the piezoelectric transforming element 122 which is formed with input electrode connecting lands 134, 135 which function as input terminal electrodes and are electrically connected respectively with the input electrodes 124, 125 and the output electrode 126, as well as, an output electrode connecting land 136 which functions as an output terminal electrode. These input electrode connecting lands 134, 135 are electrically connected to the connecting portions 124a, 125a of the input electrodes 124, 125 through a conductive adhesive 137.

As seen in FIG. 8(A), recesses 132a, 132b are preferably formed in the resilient adhesive member 132. The conductive adhesive 137 is filled in the recesses or openings 132a, 132b formed through the resilient adhesive member 132.

The recesses 132a, 132b are formed through the resilient adhesive member 132 in a manner such that they are open from a location of the connecting portions 124a, 125a to a location of the input electrode connecting lands 134, 135 of the base plate 131. The conductive adhesive 137 is applied into the recesses 132a, 132b preferably by printing or a dispenser, and then cured.

The conductive adhesive 137 preferably contains a conductive filler, a binding agent and additives. It is possible to use, as the conductive filler, an Au powder, an Ag powder, a Cu powder, an Ni powder, an Al powder, carbon black, graphite, a carbon fiber, or an Ag-soldered particle. The binder may include an acrylic resin, an epoxy resin, a vinyl resin, an acrylic-denatured polyurethane resin, a rubber-based resin, an epoxy polyamide resin, or the like. Further, the additive preferably contains a dispersing agent for enhancing filler dispersion, a lubricant for providing wear resistance, a conductive-filler sedimentation preventive agent, and other suitable substances.

The output electrode 126 of the piezoelectric transforming element 122 is preferably soldered with one end of a lead wire 141, as shown in FIG. 8(B). The other end of the lead wire 141 is preferably soldered to the output electrode connecting land 136 of the base plate 131.

In the piezoelectric transformer 121 having the structure shown in FIG. 8(A) and FIG. 8(B) and explained above, the piezoelectric transformer element 122 is supported on the base plate 131 through the resilient adhesive member 132 and because of the elasticity of the resilient adhesive member 132, there is no possibility that the piezoelectric transforming element 122 is prevented or hindered from vibrating. Also, since the conductive adhesive 137 is filled in the recesses 132a, 132b to prevent flow of the adhesive 137, the adhesive cannot spread out of the recesses 132a, 132b. Therefore, there is no necessity of increasing the mounting area for the piezoelectric transforming element 122 because it is not necessary to account and compensate for the flow of the conductive adhesive 137. Thus, a significantly reduced mounting area for the piezoelectric transforming element 122 is achieved.

Also, since the conductive adhesive 137 is substantially surrounded by the resilient adhesive member 132, the conductive adhesive 137 is maintained free of contamination from foreign matters and avoids application of an external force, improving the reliability of the piezoelectric transformer 121.

Further, since the resilient adhesive member 132 contributes to adhesion between the piezoelectric transforming element 122 and the base plate 131 except for the recesses 132a, 132b, the adhesion area is significantly increased to thereby increase the supporting strength for the piezoelectric transforming element 122.

Figure 9A:
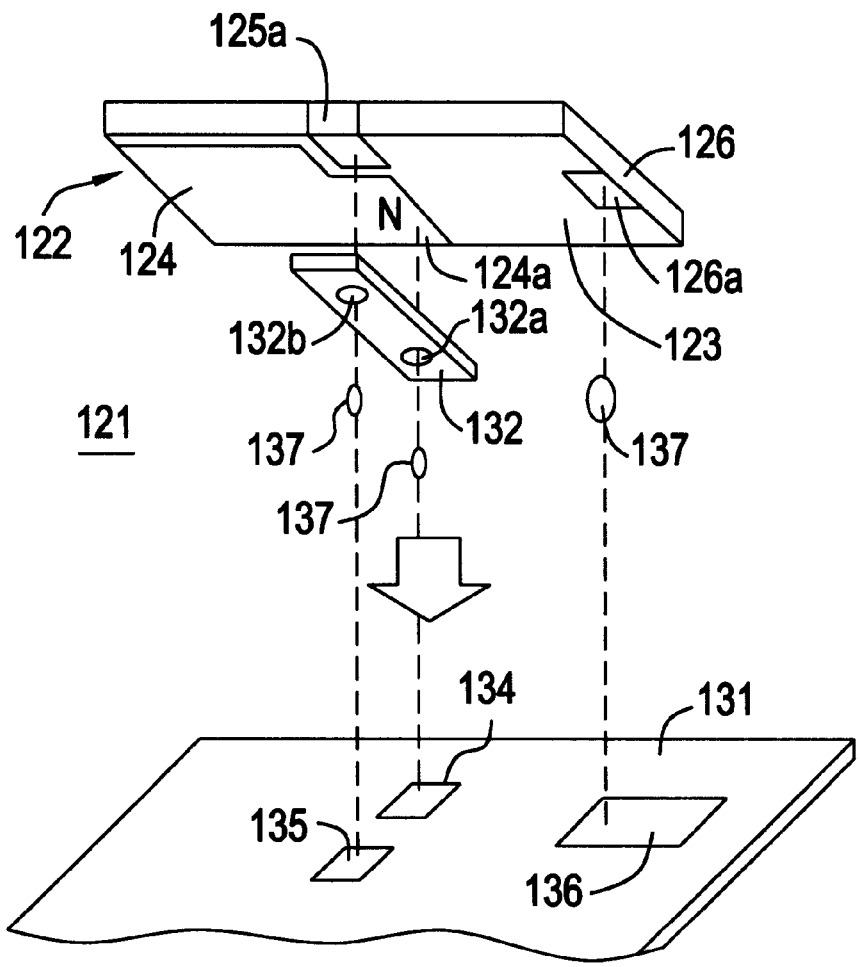
FIG. 9(A) is an exploded perspective view of a modification to the sixth preferred embodiment of the present invention.
Figure 9B:
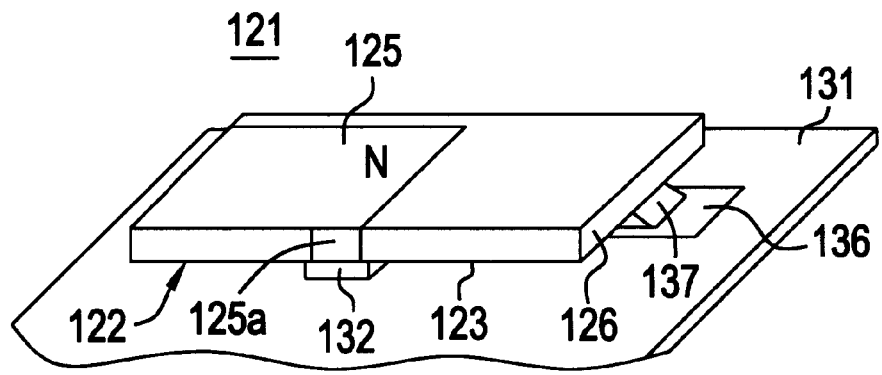
FIG. 9(B) is a perspective view of the modification to the sixth preferred embodiment of the piezoelectric transformer shown in FIG. 9(A) in an assembled state.

Although in the piezoelectric transformer 121 shown in FIG. 8(A) and FIG. 8(B) the output electrode 126 and the output electrode connecting land 136 of the base plate 131 were connected through the lead wire 141, the output electrode 126 and the output electrode connecting land 136 may be connected by a ribbon wire. Also, as shown in FIG. 9(A) and FIG. 9(B), the output electrode 126 may be extended to the bottom surface of the piezoelectric plate 123 where the input electrode 124 is located so as to form a connecting portion 126a so that the connecting portion 126a and the output electrode connecting land 136 are electrically connected therebetween via a conductive adhesive 137.

Figure 10A:
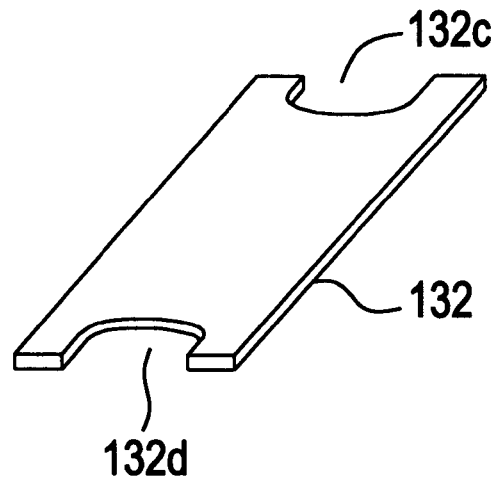
FIG. 10(A) is a perspective view of another form for the resilient adhesive member used in a seventh preferred embodiment of the present invention.
Figure 10B:
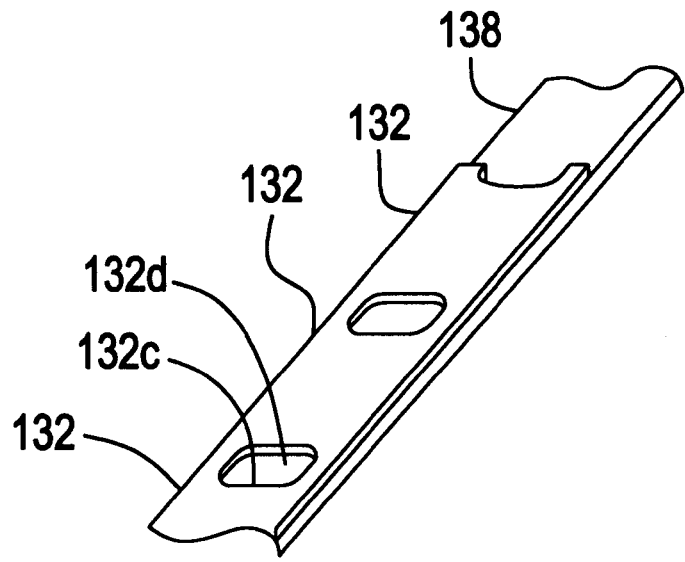
FIG. 10(B) is a perspective view of the resilient adhesive member shown in FIG. 10(A) during supply.

Further, the resilient adhesive member 132 may be formed with cut-outs 132c, 132d to have a substantially semicircular shape as shown in FIG. 10(A), in place of the substantially circular-formed recessed portions 132a, 132b. The resilient adhesive member 132, during the manufacture processes for the piezoelectric transformer 121, is preferably supplied already adhered to a separator 138 as shown in FIG. 10(B).

Figure 11A:
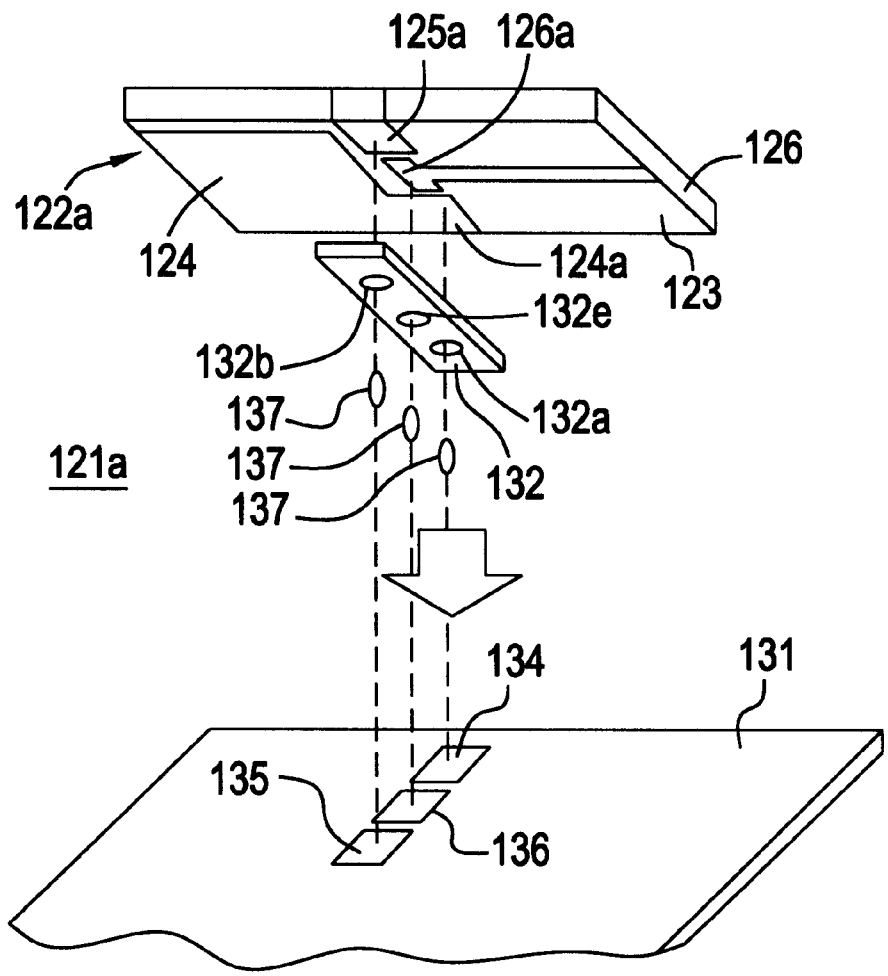
FIG. 11(A) is an exploded perspective view of an eighth preferred embodiment of the present invention.
Figure 11B:
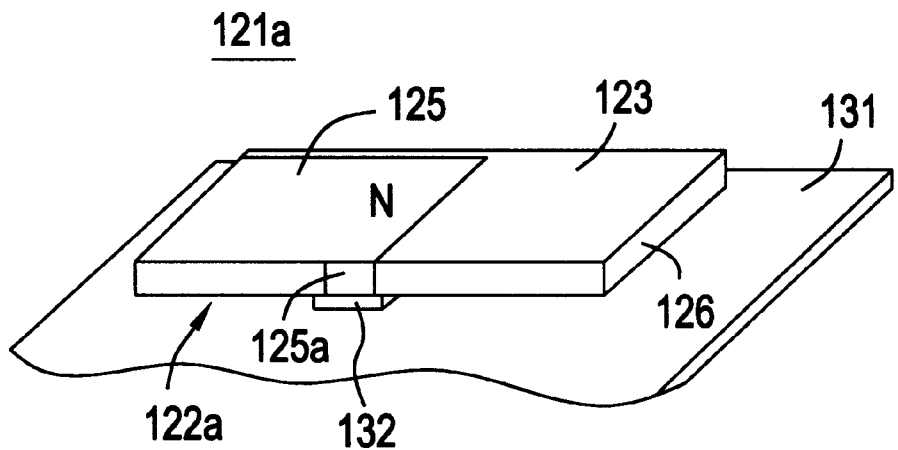
FIG. 11(B) is a perspective view of the eighth preferred embodiment of the piezoelectric transformer shown in FIG. 11(A) in an assembled state.

In a piezoelectric transformer 21a shown in FIG. 11(A) and FIG. 11(B), a piezoelectric transforming element 122a has, at a bottom surface of the piezoelectric transforming element 122a, a space located between a connecting portion 124a of the input electrode 124 and a connecting portion 125a of the input electrode 125. A connecting portion 126a of the output electrode 126 is extended so as to be located in the space provided between the connecting portion 124a and the connection portion 125a. An output electrode connecting land 136 is disposed on the base plate 131 at a position corresponding to the connecting portion 126a. This connecting portion 126a and the output electrode connecting land 136 are electrically connected therebetween through a conductive adhesive 137 filled in the recess portion 132e formed in the resilient adhesive member 132. In FIG. 11(A) and FIG. 11(B) the elements corresponding to FIGS. 8(A), 8(B) and FIGS. 9(A), 9(B) are denoted by like reference numerals to omit explanations thereof.

In the seventh preferred embodiment, since the piezoelectric transforming element 122a has the connecting portions 124a, 125a, of the input electrodes 124, 125 and the connecting portion 126a each positioned on the one of the major surfaces (bottom surface) of the piezoelectric plate 123, the conductive adhesive 137 may be provided only on the resilient adhesive member 132, further enhancing the assembling efficiency for the piezoelectric transformer 121 and reducing the mounting area for the piezoelectric transforming element 122a.

Figure 12A:
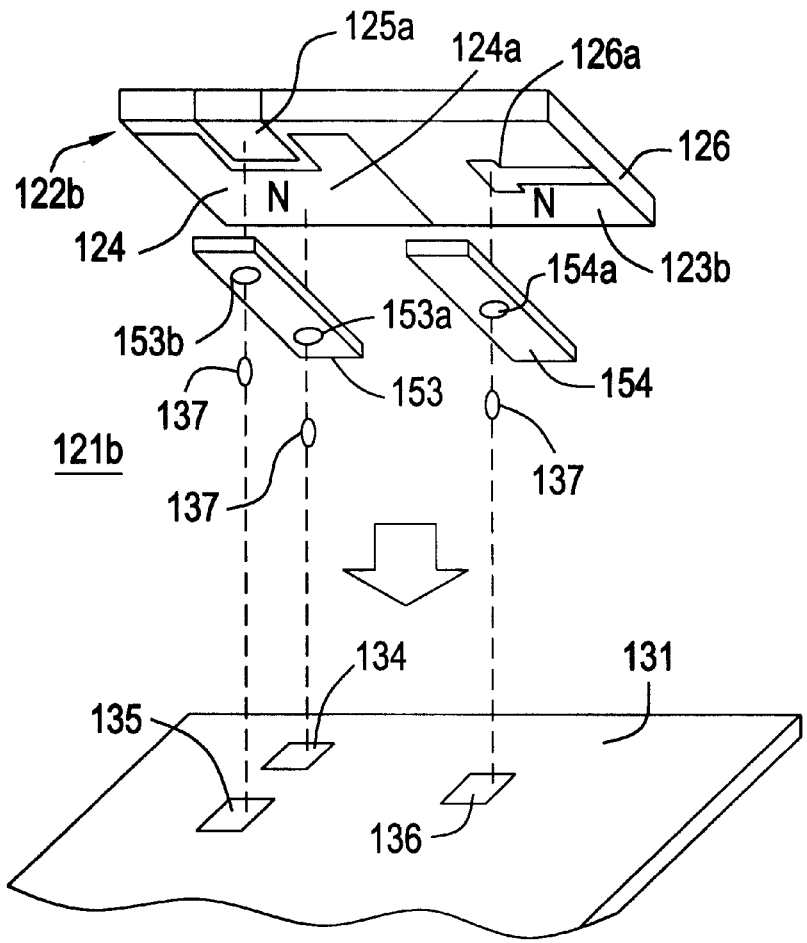
FIG. 12(A) is an exploded perspective view of a ninth preferred embodiment of the present invention.
Figure 12B:
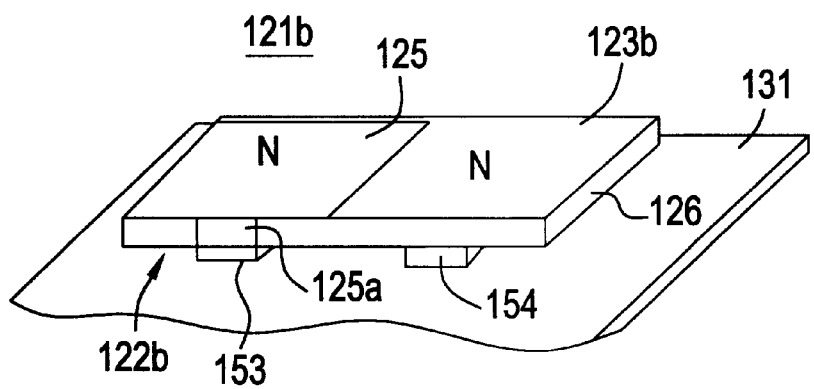
FIG. 12(B) is a perspective view of the ninth preferred embodiment of the piezoelectric transformer shown in FIG. 12(A) in an assembled state.

A piezoelectric transformer 121b shown in FIG. 12(A) and FIG. 12(B) comprises a piezoelectric transformer adapted and arranged to vibrate in the second mode ($\lambda$ mode) explained in FIG. 1 to which the structure shown in FIG. 11(A) and FIG. 11(B) is applied. A piezoelectric transforming element 122b has vibrating nodes, at which the vibrational displacement has a zero value, existing at positions spaced by about one quarter of a length of the piezoelectric plate 123b from respective ends thereof, and vibrational antinodes, at which the vibrational displacement has a maximum value, existing at the center and the both ends of the piezoelectric plate 123b.

The piezoelectric transforming element 122b has one input electrode 124 having a portion removed at a node area N corresponding to one vibrational node, as shown in FIG. 12(A). A connecting portion 125a of the other input electrode 125 extends to the portion of the input electrode 124 which has been removed at the node area N. A connected portion 126a of the output electrode 126 is extended to a node area N corresponding to the other vibrational node. The piezoelectric transforming element 122b is held at the two node regions N by the base plate 131 through the resilient adhesive members 153, 154. The connecting portions 124a, 125a of the input electrodes 124, 125 are connected to the input electrode connecting lands 134, 135 through the conductive adhesive 137 provided in the recessed portions 153a, 153b formed in the resilient adhesive member 153. Also, the connecting portion 126a of the output electrode 126 is connected to the output electrode connecting land 136 through the conductive adhesive 137 disposed in the recessed portion 154a formed in the resilient adhesive member 154.

In the seventh preferred embodiment, it is possible to further reduce the mounting area required for the piezoelectric transformer of the second vibrational mode, facilitating application of a conductive adhesive 137 and enhancing the efficiency of assembling the piezoelectric transformer.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric transformer, comprising:

a piezoelectric transforming element having a piezoelectric plate, and an input electrode and an output electrode provided on the piezoelectric plate;

a base plate supporting the piezoelectric transforming element and including at least one terminal electrode disposed on a surface thereof;

a resilient adhesive member being one of an adhesive tape and an adhesive rubber sheet and disposed only between the piezoelectric transforming element and the base plate for physically securing the piezoelectric transforming element to the base plate; and a conductive adhesive disposed only between the piezoelectric transformer element and the base plate for electrically connecting at least one of the input and output electrodes to the at least one terminal electrode provided on the base plate.

2. A piezoelectric transformer according to claim 1, wherein at least one of the input and output electrodes has a connecting portion provided on a main surface of the piezoelectric plate and is arranged to face the base plate, and the connecting portion and the at least one terminal electrode are electrically connected to each other through the conductive adhesive.

3. A piezoelectric transformer according to claim 2, wherein the resilient adhesive member is located between the connecting portion and the at least one terminal electrode, and the connecting portion and the at least one terminal electrode are electrically connected therebetween through the conductive adhesive.

4. A piezoelectric transformer according to claim 1, wherein the resilient adhesive member includes recesses formed therein, the conductive adhesive being located in the recesses in the resilient adhesive member.

5. A piezoelectric transformer according to claim 3, wherein the resilient adhesive member and the conductive adhesive are positioned at a nodal portion of the piezoelectric plate at which a vibrational node of the piezoelectric transforming element exists.

6. A piezoelectric transformer according to claim 1, wherein the conductive adhesive includes a conductive filler and a binding agent.

7. A piezoelectric transformer according to claim 6, wherein the conductive adhesive further includes an additive including at least one of a dispersing agent, a lubricant and a conductive-filler sedimentation preventive agent.

8. A piezoelectric transformer according to claim 1, wherein the conductive adhesive is disposed at opposite outer edges of the resilient adhesive member.

9. A piezoelectric transformer according to claim 1, wherein the conductive adhesive is disposed at outer edges of the piezoelectric transforming element and both the conductive adhesive and the resilient adhesive member are in contact with a surface of the base plate and a surface of the piezoelectric transforming element.

10. A piezoelectric transformer according to claim 1, wherein the base plate includes a plurality of terminal electrodes each of which is connected to a respective one of the input electrode and the output electrode provided on the piezoelectric plate.

11. A piezoelectric transformer according to claim 1, wherein the base plate includes a plurality of terminal electrodes disposed thereon and aligned in a substantially straight line.

12. A piezoelectric transformer according to claim 1, wherein the piezoelectric transforming element is arranged and adapted to vibrate in a primary vibration mode.

13. A piezoelectric transformer according to claim 1, wherein the piezoelectric transforming element is arranged and adapted to vibrate in a second order vibration mode.

14. A piezoelectric transformer, comprising:

a piezoelectric transforming element having a piezoelectric plate, and an input electrode and an output electrode provided on the piezoelectric plate;

a base plate supporting the piezoelectric transforming element and including at least one terminal electrode disposed on a surface thereof;

a connecting member disposed between the base plate and the piezoelectric transforming element for mechanically and electrically connecting the piezoelectric transforming element to the base plate, wherein the connecting member includes a resilient insulative adhesive member being one of an adhesive tape and an adhesive rubber sheet and disposed only between the piezoelectric transforming element and the base plate for physically securing the piezoelectric transforming element to the base plate and a conductive adhesive disposed between the piezoelectric transforming element and the base plate for electrically connecting at least one of the input and output electrodes to the at least one terminal electrode provided on the base plate.

15. A piezoelectric transformer according to claim 14, wherein the resilient adhesive member has recesses formed therein and the conductive adhesive is disposed in the recesses formed in the resilient adhesive member for electrically connecting at least one of the input and output electrodes to the at least one terminal electrode provided on the base plate.

16. A piezoelectric transformer according to claim 14, wherein at least one of the input and output electrodes has a connecting portion provided on a main surface of the piezoelectric plate and is arranged to face the base plate, and the connecting portion and the at least one terminal electrode are electrically connected to each other through the connecting member.

17. A piezoelectric transformer according to claim 16, wherein the connecting member is located between the connecting portion and the at least one terminal electrode, and the connecting portion and the at least one terminal electrode are electrically connected therebetween through the conductive adhesive.

* * * * *